United States Patent [19]

Jastrzebski

[11] Patent Number: 4,654,681
[45] Date of Patent: Mar. 31, 1987

[54] ARRANGEMENT OF SEMICONDUCTOR DEVICES ON A WAFER

[75] Inventor: Lubomir L. Jastrzebski, Plainsboro, N.J.

[73] Assignee: RCA Corporation, Princeton, N.J.

[21] Appl. No.: 782,578

[22] Filed: Oct. 1, 1985

[51] Int. Cl.⁴ .................... H01L 29/78; H01L 27/14; H01L 31/00

[52] U.S. Cl. ......................................... 357/24; 357/30

[58] Field of Search ................. 357/24, 30; 377/57–63

[56] References Cited

U.S. PATENT DOCUMENTS 4,266,334  5/1981  Edwards et al. ...................... 29/583
4,362,575  12/1982  Wallace ................................ 148/1.5

Primary Examiner—Gene M. Munson
Attorney, Agent, or Firm—Birgit E. Morris; Donald S. Cohen

[57] ABSTRACT

The yield of field transfer CCD imagers made in a wafer of single crystalline silicon is improved by making the imagers in groups of at least two imagers, and preferably four imagers, with the A-registers of all the imagers in a group being adjacent each other. The groups of imagers are formed in columns on the surface of the wafer with one group being at the center of the wafer and the other group being around the center group and positioned radially outwardly form the center group toward the edge of the wafer.

4 Claims, 3 Drawing Figures

ARRANGEMENT OF SEMICONDUCTOR DEVICES ON A WAFER

The present invention relates to a method of making semiconductor devices and an article resulting therefrom. More particularly, the present invention relates to a method of arranging the semiconductor devices on a wafer to improve the yield of the devices from the wafer.

BACKGROUND OF THE INVENTION

Frame transfer CCD imagers, in general, include three sections: a photosensing array, known as the A-register; a temporary storage array, known as the B-register; and an output register, known as the C-register. The A-register receives the light and converts the photons to electrons. The electrons generated in the A-register are then transferred to the B-register and then to the C-register. Since the physical condition of the substrate in which the CCD is formed can affect the conversion of photons to electrons, any physical defects in the substrate in which the A-register is formed, can have an adverse effect on the operation of the A-register. It has been found that in a large, circular wafer of single-crystalline silicon of the type in which CCD imagers are made, the striation intensity increases with distance from the center of the wafer. Because of this, it has been found that when a plurality of the CCD imagers are formed in the wafer, the yield of good imagers varies across the area of the wafer. Therefore, it would be desirable to have a method of making the CCD imagers in which the yield of good imagers is increased across the entire area of the wafer.

SUMMARY OF THE INVENTION

Semiconductor devices having portions whose characteristics are affected by striations in a wafer of single crystalline silicon are along the surface of the wafer with those portions which are affected by striations being as close as possible to the center of the wafer. For example, a charge-coupled device imager which includes an A-register, a B-register adjacent a side of the A-register and a C-register adjacent the side of the A-register away from the A-register are formed in the wafer in groups of at least two imagers with one group being formed at the center of the wafer and the other groups being formed around the center group and radially outwardly toward the edge of the wafer. The imagers in each group are arranged with the A-register of the imagers being adjacent each other.

DETAILED DESCRIPTION OF PREFERRED EMBODIMENT

Figure 1:
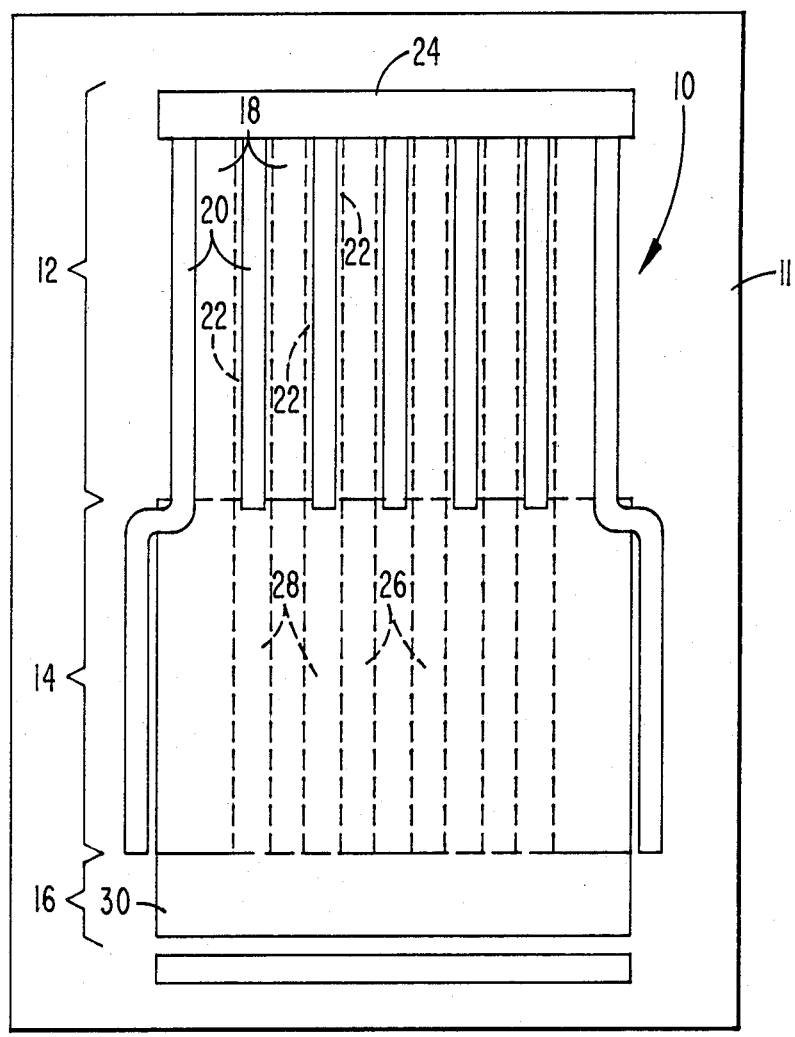
FIG. 1 is a schematic view of a typical frame transfer CCD imager.

Referring initially to FIG. 1, a frame transfer CCD image sensor is generally designated as 10. The CCD image sensor 10 is formed in a substrate 11 of single crystalline silicon and includes a photosensing array 12, known as an A-register, a temporary storage array 14, known as a B-register, and an output register 16 known as a C-register. The A-register 12 includes a plurality of spaced, parallel channels 18 of N type conductivity within the substrate 11, which is of P type conductivity. The channels 18 are separated by anti-blooming overflow drain regions 20 of N+ type conductivity. A shallow barrier region 22 extends between each of the overflow drain regions 20 and the adjacent channel regions 18. A P type well (not shown) surrounds each of the overflow drain regions 20. This structure of an A-register is shown and described in more detail in Pat. No. 4,362,575 to L. F. Wallace, issued Dec. 7, 1982, entitled "Method of Making Buried Channel Charge-Coupled Device With Means For Controlling Excess Charge" which is incorporated herein by reference. At the end of the A-register 12, away from the B-register 14, a connecting region 24 of N+ type conductivity is within the substrate 11. The connecting region 24 extends tranversely across and is connected to the ends of the channel 18. A plurality of conductive gates (not shown) extend in parallel relation transversely across the channels 18 and are insulated therefrom by an intermediate layer of silicon oxide.

The B-register 14 includes a plurality of spaced, parallel channels 26 of N type conductivity within the substrate 11. Each of the B-register channels 26 is co-extensive with and extends from a separate A-register channel 18. Between the channels 26 are channel stop regions 28 of P type conductivity. Each of the B-register channel stops 28 is co-extensive with and extends from a separate one of the A-register drains 20. A plurality of parallel, conductive gates (not shown) extend transversely across the B-register channels 26 and are insulated from the channels 26 and channel stop regions 28 by a thin layer of silicon oxide.

The C-register 16 includes a channel 30 which extends transversely across the ends of the B-register channels 26. The C-register channel 30 is a region of N type conductivity within the substrate 11. The N type region forming the C-register channel 30 is an extension of the N-type regions forming the B channel regions 26. A plurality of parallel, conductive gates (not shown) extend transversely across the C-register channel 30 substantially perpendicular to the gates in the B-register 14. The C-register gates are insulated from the channel 30 by a thin layer of silicon oxide. The substrate 11 may also include therein regions forming various components of the input and output circuits for the imager 10.

The CCD imager 10 is made by forming a plurality of the imagers on a large circular wafer of single crystalline silicon and then cutting the wafer apart into the individual imagers. The various regions of the imager, such as the channel regions, channel stops and blooming drains, are formed by embedding conductivity modifiers of the appropriate conductivity type into the appropriate areas of the wafer, such as by diffusion or ion implantation. To achieve this, a layer of a photoresist is coated over the wafer, and, using standard photolithographic techniques, is defined to form openings therein over the particular areas where the conductivity modifiers are to be embedded. To form the various regions, a number of the photoresists application steps and photolithographic defining steps are required. Also, the photoresist application steps and photolithographic defining steps are used to form the gates of the various registers and to form contact openings in protective layers coated over the imagers. Thus, the formation of the imagers 10 requires the use of a number of photolithographic definition steps.

In order to achieve the high definition required for the CCD imagers 10, it has been the practice to carry out these photolithographic definition steps using a step and repeat projection printer. In a step and repeat projection printer, there is used a mask having thereon a pattern which is a repetitive portion of the pattern to be formed in the photoresist layer. The mask is aligned with a portion of the surface area of the photoresist layer which is then exposed to light through the mask. The wafer is then moved, i.e. stepped, so that the pattern on the mask is then aligned with a next portion of the surface of the photoresist layer which is then exposed. By repeating the step movement of the wafer with respect to the mask and exposing the photoresist layer at each step, the repetitive pattern is formed in the photoresist layer over the entire area of the photoresist layer.

Figure 2:
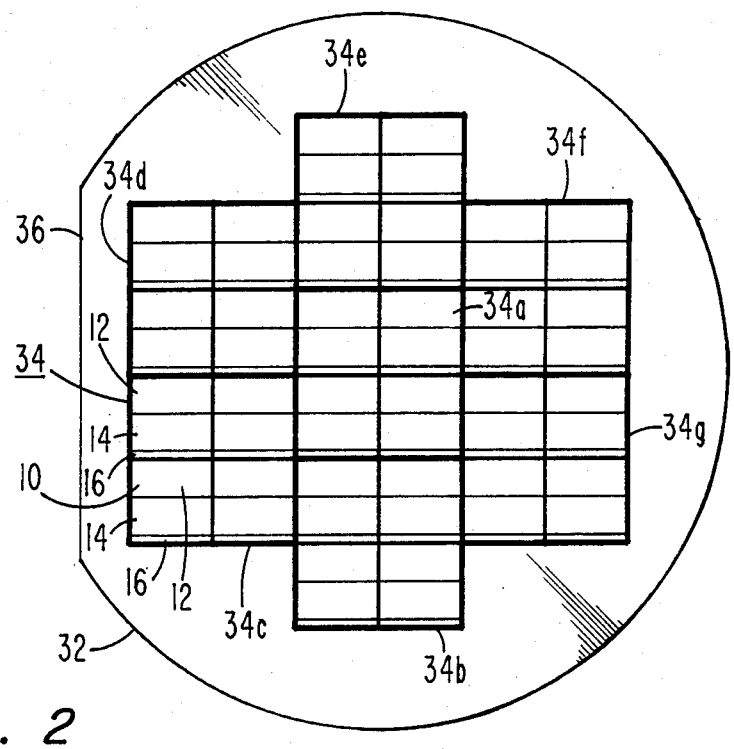
FIG. 2 is a plane view of the prior art manner of arranging the CCD imagers on a wafer.

In forming CCD imagers 10, the repetitive pattern which is generally used in a group of at least two of the imagers 10. As shown in FIG. 2, the practice heretofore used has been to form the CCD imagers 10 on a wafer 32 in a repetitive pattern of a group, indicated at 34, of four imagers 10. The imagers 10 are formed in the group 34 in a rectangle with a corner of each of the imagers 10 being at the center of the rectangle so that the imagers 10 are arranged in two rows of two imagers. The imagers 10 in each group 34 are positioned in the same manner so that the A-registers 12 of the imagers 10 in one row are adjacent the C-registers 16 in the other row. When the mask containing the particular pattern for the group 34 is stepped across the layer of photoresist on the wafer 32, it is stepped along lines parallel to the alignment flat 36 of the wafer 32. Thus, the groups 34 of the imagers 10 are formed in columns with one of the groups 34a being at the center of the wafer 32 and the other groups 34b-34g being arranged around the center group 34a and radially outwardly therefrom toward the edge of the wafer 32.

With the CCD imagers 10 being formed in the manner previously described, it has been found that the yield of good imagers 10 varies across the wafer 32. Considering the group 34b being at the bottom of the wafer 32 and the group 34e being at the top of the wafer 32, it has been found that there is a high yield of imagers 10 across the bottom and center of the wafer 32 but a low yield across the top of the wafer. It has been found that this variation in yield is a result of the striations in the surface of the wafer 32. As previously stated, the density of striations increases from the center of the wafer 32 radially outwardly toward the edge of the wafer. It can be seen in FIG. 2, that the A-registers 12 in the groups 34 formed along the bottom and center of the wafer 32, i.e. the groups 34a, 34b, 34c and 34g, are relatively close to the center of the wafer 32. However, in the groups across the top of the wafer 32, i.e. the groups 34d, 34e and 34f, the A-registers 12 of many of the imagers 10 are closer to the edge of the wafer 32. Since the A-register 12 of the imager 10 is the portion of the imager which is adversely affected by striations, those imagers 10 which have A-registers 12 being formed closer to the edge of the wafer 32 are more likely to be defective so that the yield of imagers 10 is lower across the top of the wafer 32.

Figure 3:
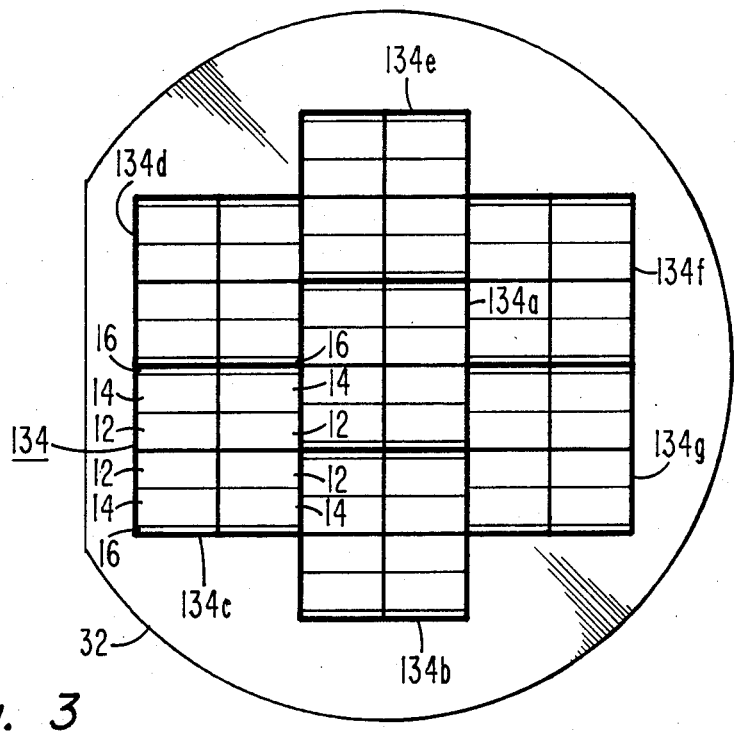
FIG. 3 is a plane view of the manner of the present invention of arranging the CCD imagers on a wafer.

In the present invention the yield of CCD imagers 10 from a wafer 32 is improved by changing the arrangement of the imagers 10 in each group 34. Referring to FIG. 3, the position of two of the CCD imagers 10 in each group 134 is reversed so that the A-registers 12 of all four imagers 10 are adjacent each other. Thus, considering the group 134b being at the bottom of the wafer 32 and the group 134e being at the top of the wafer, the two CCD imagers 10 at the top of each group 134 is reversed in position with respect to the previous arrangement of the imagers 10. Therefore, when all of the groups of imagers 134 are formed on the wafer 32, the A-registers 12 of the uppermost two of the imagers 10 in the groups 134d, 134e and 134f across the top portion of the water 32 are now closer to the center of the wafer 32. Likewise, in the centermost group 134a, all of the A-registers 12 of the imagers 10 are at the center of the wafer 32. Although in the groups 134c, 134b and 134g across the bottom portion of the wafer 32 the A-registers 12, two of the imagers 10 in each group may be further from the center than in the prior arrangement, the difference in position is only slight and therefore does not have any effect on the yield. Therefore, in the arrangement of the imagers 10 of the present invention shown in FIG. 3, the A-registers 12 of a large number of the CCD imagers 10 are closer to the center of the wafer 32 where the density of the striations is smaller so that the yield of imagers 10 from the wafer 32 is increased. Thus, the arrangement of the imagers 10 in each group 134 of the present invention improves the yield of the CCD imagers 10 from the wafer 32.

Although the present invention has been described with regard to making CCD imagers, the method can also be used to make other types of semiconductor devices whose operations can be affected by striations in the wafer in which the device is formed. For example, striations can cause resistivity variations in the wafer which would affect the threshold voltages of various types of transistors formed in the wafer. Also striations affect dark current generation which is a problem in dynamic memories. Therefore, when making any type of semiconductor device whose characteristics are affected by striations in the wafer, the semiconductor device should be made in accordance with the present invention by arranging the portions of the semiconductor device which are affected by the striations as close as possible to the center of the wafer where the intensity of striations are the smallest.

I claim:
1. A semiconductor device comprising
    a circular wafer of single crystalline silicon,
    a plurality of charge-coupled device imagers on said surface of the wafer with each imager including an A-register, a B-register and C-register, said imagers being arranged in groups of four imagers with the A-register of each imager in each group arranged adjacent a common point, one group being at the center of the wafer and the other groups being around the center group and radially outwardly of the center group toward the edge of the wafer so that the A-registers of all of the imagers are as close as possible to the center of the wafer.

2. A semiconductor device in accordance with claim 1 wherein the groups of imagers are arranged in parallel columns.

3. A semiconductor device in accordance with claim 2 wherein the wafer has an alignment flat along its edge and the columns of imagers are parallel to said alignment flat.

4. A semiconductor device in accordance with claim 2 wherein each group of four imagers is arrayed in a rectangle having two rows of two imagers.

* * * * *